United States Patent [19]

Hamasaki

[11] Patent Number: 4,830,972
[45] Date of Patent: May 16, 1989

[54] METHOD OF MANUFACTURING BIPOLAR TRANSISTOR

[75] Inventor: Toshihiko Hamasaki, Yokohama, Japan

[73] Assignee: Kabushiki Kaisha Toshiba, Kawasaki, Japan

[21] Appl. No.: 152,298

[22] Filed: Feb. 4, 1988

[30] Foreign Application Priority Data

Feb. 6, 1987 [JP] Japan .................. 62-25728

[51] Int. Cl.$^4$ .......................................... H01L 21/306
[52] U.S. Cl. ....................................... 437/31; 437/33; 437/162; 437/197; 437/233; 437/191
[58] Field of Search ................... 437/31, 32, 33, 160, 437/162, 157, 158, 156, 148, 147, 141, 191, 193, 228, 233; 357/34, 35, 59 H; 156/653, 657; 148/DIG. 10, DIG. 11

[56] References Cited

U.S. PATENT DOCUMENTS

| 4,463,493 | 8/1984 | Momose | 437/67 |
| 4,531,282 | 7/1985 | Sakai | 437/193 |
| 4,571,817 | 2/1986 | Birrittella | 437/196 |
| 4,717,689 | 1/1988 | Maas | 437/186 |
| 4,746,629 | 3/1988 | Hanagasaki | 437/233 |
| 4,780,427 | 10/1988 | Sakai | 437/197 |

FOREIGN PATENT DOCUMENTS 57-32511 12/1982 Japan .

OTHER PUBLICATIONS

Electronics Letters, vol. 19, No. 8, pp. 283-284, 1983 T. Sakai et al.

Denshitsushingakkaishi vol. J. 69-c, No. 2 pp. 176-181, 1986.

Primary Examiner—Brian E. Hearn
Assistant Examiner—Kevin McAndrews
Attorney, Agent, or Firm—Oblon, Fisher, Spivak, McClelland & Maier

[57] ABSTRACT

A method of manufacturing an ultra-miniaturized bipolar transistor is disclosed, wherein an insulating film and a first polysilicon film doped with an impurity of a second conductivity type are formed, in this order, as a collector on a semiconductor layer of a first conductivity type. After an opening is formed in a predetermined portion of the first polysilicon film, the insulating film is etched, using the first polysilicon film as a mask, to expose part of a surface of the substrate. Thereafter, an undoped second polysilicon film is deposited on the resultant structure, and is annealed without etching. Then, the impurity doped in the first polysilicon film is diffused into part of the second polysilicon film and simultaneously into the substrate to form an external base region of a second conductivity type. The second polysilicon film is etched by use of an etching method wherein the etching rate in an undoped region is much higher than that in an impurity-doped region. As a result, the undoped region can be selectively removed without using a mask, thereby exposing the substrate surface. Subsequently, an oxide film is formed on the polysilicon film and the substrate surface, and an impurity is doped through the opening to form an internal base layer. Thereafter, an emitter layer is formed, in a self-aligned manner, in the internal base region.

10 Claims, 8 Drawing Sheets

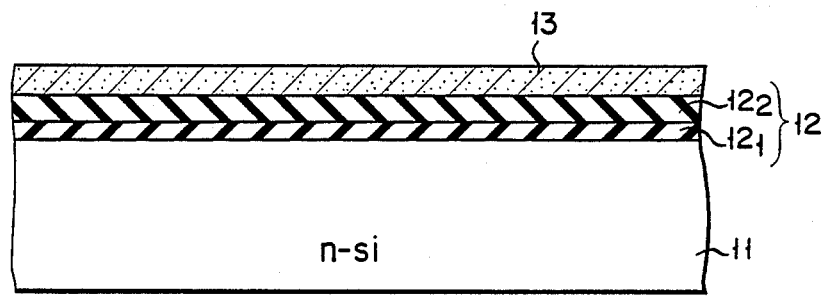
F I G. 2A
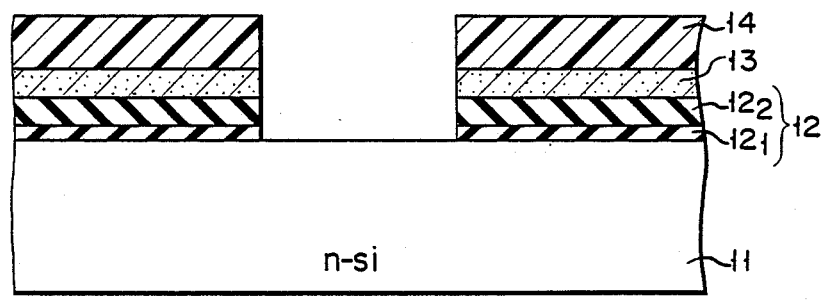
F I G. 2B
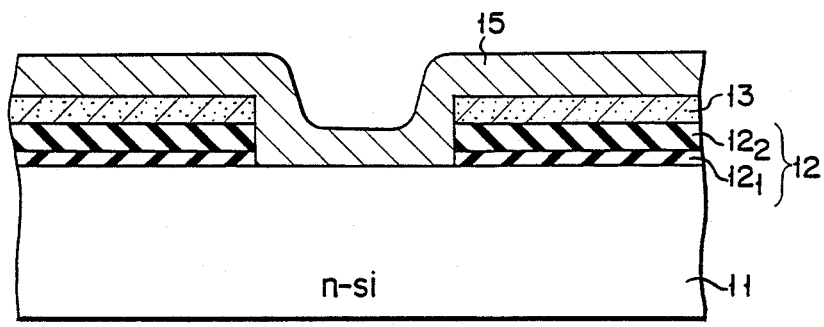
F I G. 2C

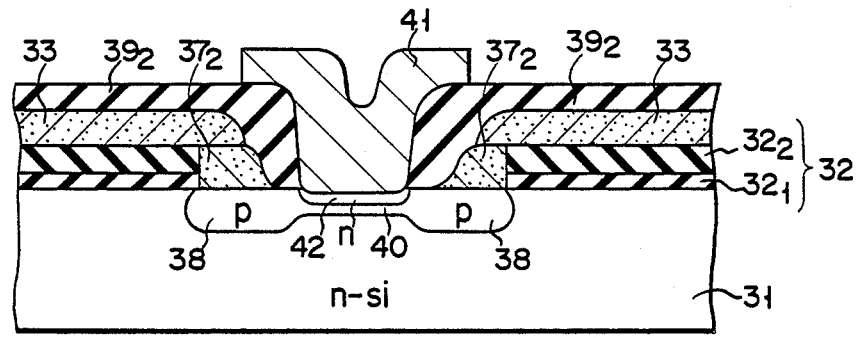
F I G. 3J
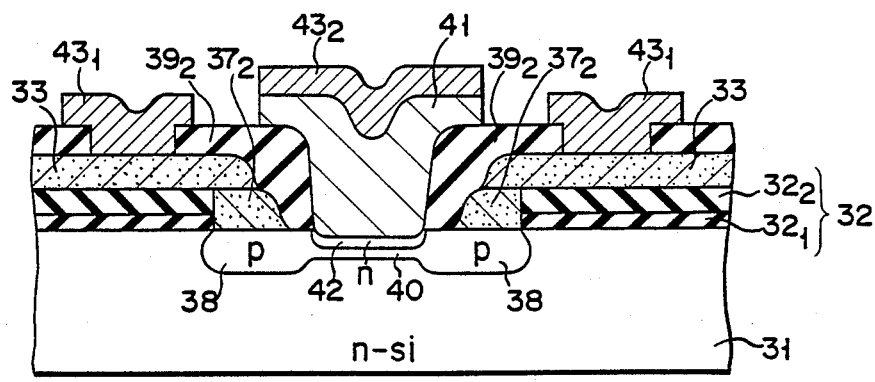
F I G. 3K

METHOD OF MANUFACTURING BIPOLAR TRANSISTOR

BACKGROUND OF THE INVENTION

1. Field of the Invention

The present invention relates to a method of manufacturing a bipolar transistor and, more particularly, to a method of manufacturing an ultra-miniaturized bipolar transistor for an integrated circuit.

2. Description of the Prior Art

The method of manufacturing an ultra-miniaturized bipolar transistor as shown in FIGS. 1A to 1C, for example, is a known conventional method (S. Konaka et al., Extended Abstracts of the 16th Conf. on Solid State Devices and Materials, 1984, p. 209 to 212), and can be schematically described as follows:

Referring to FIG. 1A, insulating film 2 is formed on semiconductor substrate (in this case, n-type Si substrate) 1, and impurity-doped (in this case, p-type impurity) first polysilicon (or polycrystaline silicon) film 3 is deposited on the resultant structure. An opening is formed in a predetermined portion of first polysilicon film 3, after which insulating film 2 is etched, using first polysilicon film 3 as a mask, to expose part of a surface of semiconductor substrate 1. In this case, as is shown in FIG. 1A, insulating film 2 is laterally overetched to form undercut portion 4 under first polysilicon film 3. Thereafter, undoped second polysilicon film 5 is deposited on the resultant structure.

Subsequently, as is shown in FIG. 1B, second polysilicon film 5 is etched, with the result that only portions thereof which are buried under undercut portions 4 remain. The resultant structure is thermally oxidized to form oxide films $6_1$ and $6_2$ on first and second polysilicon films 3 and 5, and on the exposed surface of substrate 1, respectively. Upon thermal oxidation, a p-type impurity contained in first polysilicon film 3 is diffused into second polysilicon film 5 and also into substrate 1, to form p-type external base region 7. By using this method, the width of external base region 7 can be controlled with accuracy. Since the width of the external base region of an integrated circuit greatly influences the transistor characteristics, use of this method is thus particularly advantageous.

Next, as is shown in FIG. 1C, a p-type impurity is ion implanted into substrate 1 passing through the opening and penetrating oxide film $6_2$, to form internal base region 8. Then, undoped third polysilicon film 9 is deposited on the entire surface of the resultant structure and is etched back to a depth corresponding to the thickness of third polysilicon film 9. Thus, film 9 remains only on the side wall of the opening. In the state wherein the diameter of the opening is decreased in this manner, oxide film $6_2$ is removed to form an opening portion. Then, an n-type impurity is doped into substrate 1 through the opening portion, to form self-aligned emitter region 10 in internal base region 8. Generally, diffusion is carried out in the emitter region by using a polysilicon film doped with an n-type impurity as a diffusion source.

Thereafter, necessary terminal electrodes is formed by an ordinary process, thereby obtaining a bipolar transistor. In this case, first polysilicon film 3 can be used as a part of a base electrode.

The above conventional method, however, has the following drawbacks.

First, when second polysilicon film 5 is etched such that the only part thereof remaining is part buried in undercut portions 4 under first polysilicon film 3, control of the etching is difficult. Since second polysilicon film 5 left in this manner determines the width of external base region 7 which will be formed by the subsequent thermal oxidation, control of etching is very important.

Second, when oxide films $6_1$ and $6_2$ are formed, defects tend to occur in the crystal structure of the surface layer of substrate 1 due to the considerable pressure which is applied to the surface of substrate 1 when polysilicon film 5 expands in volume upon its oxidation. Crystal defects in this region lead to an increase in current leakage of a transistor. The reason why the stress is increased in oxidation process is that the exposed end face of second polysilicon film 5, which is buried in undercut portions 4, becomes steep. When this steep edge is oxidized, the stress caused by volume expansion cannot escape upward, but is directly applied onto substrate 1.

Third, in order to reduce the width of the emitter, a step is required for forming polysilicon film 9 on the side wall defining the opening of the first polysilicon film 3, thereby complicating the steps.

SUMMARY OF THE INVENTION

It is a object of the present invention to provide a method of manufacturing a high-performance, ultraminiaturized bipolar transistor having only a small leakage current, wherein the problems associated with the conventional method described above are solved, control during the main etching steps is excellent and a complicated step is not included.

The above object can be achieved by use of a manufacturing method which will now be described.

An insulating film is formed on a semiconductor layer of a first conductivity type, this layer to be later formed into a collector region, and a first polysilicon film doped with an impurity of a second conductivity type is deposited on the resultant structure. After an opening is formed in a predetermined portion of the first polysilicon film, the insulating film is etched, using the first polysilicon film as a mask, to expose part of a surface of the substrate. Subsequently, an undoped second polysilicon film is deposited on the resultant structure. The second polysilicon film is annealed without etching, so that the impurity doped in the first polysilicon film is diffused into part of the second polysilicon film and simultaneously diffused into the substrate. As a result, an external base region of the second conductivity type is formed.

Next, the second polysilicon film is etched using etching method wherein the etching rate in an undoped region is much higher than that in an impurity-doped region (i.e., the etching selectivity is high with regard to the undoped region). An etching method suitable for this purpose is wet etching using an aqueous solution containing hydrazine or potassium hydroxide as an etchant. By using such an etching method, the undoped region can be selectively removed without using a mask, thereby exposing a surface of the substrate.

Subsequently, an oxide film is formed on the polysilicon film and the surface of the substrate, and an impurity is doped through the opening to form an internal base layer. Thereafter, an emitter layer is formed, in a self-aligned manner, in the internal base layer.

As is described above, according to the method of the present invention, an undoped second polysilicon film is deposited and annealed without etching, and an impurity contained in a first polysilicon film is diffused therein to form an external base. In this case, impurity diffusion is performed in a special manner, as will be described in detail hereinafter with reference to an embodiment of the present invention.

By etching a second polysilicon film using an etching method having a high etching selectivity with respect to an undoped region, the second polysilicon film can be left on th external base layer with high controllability. In addition, the edge of the second polysilicon film is inclined at a predetermined angle. Therefore, when an oxide film is subsequently formed, only a small stress is applied to the substrate, thereby obtaining a transistor having only a small leakage current.

In addition, when thermal oxidation is performed after an external base region is formed, only the impurity-doped polysilicon film is present. Since the oxidation speed of an impurity-doped polysilicon film is considerably high, a thick oxide film can be formed on the end face of the polysilicon film, which defines the opening. Therefore, in contrast to the conventional method, the method according to the present invention does not require the step of forming a polysilicon film on the side wall of the opening portion of the polysilicon film, in order to reduce the width of the emitter region.

BRIEF DESCRIPTION OF THE DRAWINGS

FIGS. 2A to 2I are sectional views sequentially showing the steps of manufacturing a transistor according to an embodiment of the present invention; and FIGS. 3A to 3K are sectional views sequentially showing the steps of manufacturing a transistor according to another embodiment of the present invention.

DETAILED DESCRIPTION OF THE PREFERRED EMBODIMENTS

The manufacturing method of the present invention will now be described in detail, with reference to the preferred embodiments.

FIGS. 2A to 2I are sectional views showing the steps of manufacturing an npn transistor according to an embodiment of the present invention.

As is shown in FIG. 2A, boron-doped first polysilicon film 13 is deposited on insulating film 12, which is formed on n-type Si substrate 11. Insulating film 12 is constituted by 1,000 Å-thick silicon oxide film $12_1$ formed by thermally oxidizing the surface of Si substrate 11, and 2,000 Å-thick silicon nitride film $12_2$ formed by use of the CVD method. Boron may be doped in polysilicon film 13 simultaneously with the deposition thereof on film 12, or else may be doped by way of ion implantation following deposition.

Thereafter, as is shown in FIG. 2B, following the formation of resist pattern 14, first polysilicon film 13 is etched, using the reactive ion etching method (to be referred to as RIE), with resist pattern 14 being used as a mask, to form an opening in first polysilicon film 13. Nitride and oxide films $12_2$ and $12_1$ are sequentially etched by chemical dry etching and wet etching, respectively, to obtain the structure shown in FIG. 2B. In this embodiment, these insulating films are etched so as not to form undercut portions, as shown in FIG. 2B.

Figure 2D:
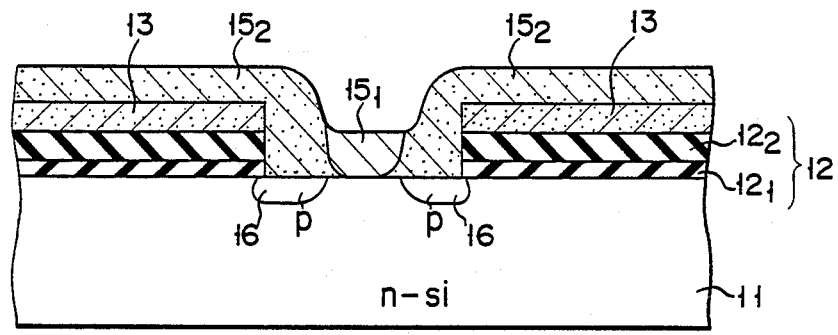

As is shown in FIG. 2C, following removal of resist pattern 14, undoped second polysilicon film 15 is deposited to a thickness of 3,000 Å on the entire surface of the resultant structure. Annealing is then performed to cause thermal diffusion of the boron contained in first polysilicon film 13. As a result, as is shown in FIG. 2D, boron is diffused into part of second polysilicon film 15, and also into part of substrate 11, thereby forming external base region 16. As is shown in FIG. 2D, part of second polysilicon film 15 is remained as undoped region $15_1$ at the center of the opening, and the remaining part of second polysilicon film 15 is converted to boron-doped region $15_2$.

When thermal diffusion takes place, the diffusion length of boron increases near the interface between second polysilicon film 15 and silicon substrate 11. As a result, the end faces of impurity regions $15_2$ and 16 are inclined to the surface of substrate 1 at a predetermined angle because of such a unique diffu- sion.

Figure 2E:
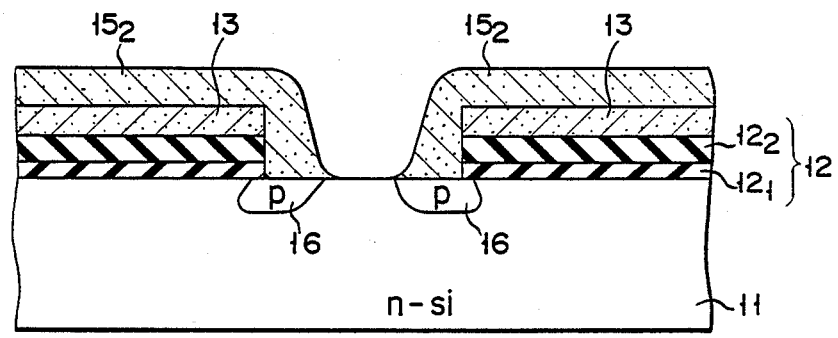

As is shown in FIG. 2E, undoped region $15_1$ of second polysilicon film 15 is selectively etched by wet etching, using a solution containing hydrazine, to expose part of a surface of substrate 11. Since, according to this etching method, the etching rate of undoped polysilicon is sufficiently higher than that of impurity-doped polysilicon, undoped region $15_1$ can be selectively removed without the need to use a mask. Upon completion of etching, the end face defining the opening is inclined at a predetermined angle with respect to the surface of substrate 11 in accordance with the state of boron diffusion.

Figure 2F:
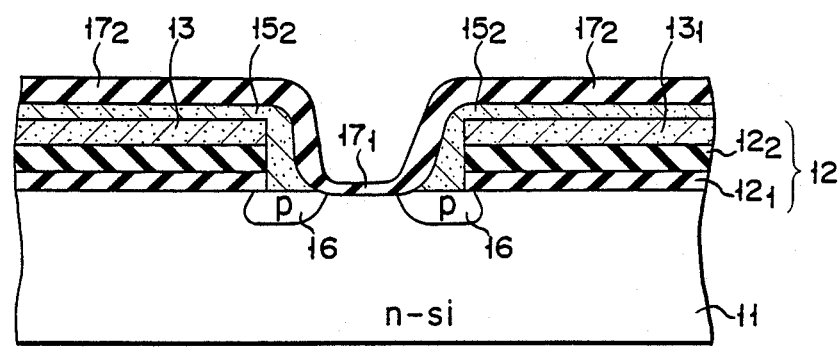

As is shown in FIG. 2F, oxide films $17_1$ and $17_2$ are respectively formed on the surfaces of substrate 11 and polysilicon film $15_2$ by means of thermal oxidation. Due to the difference in the oxidation speed of single crystal substrate 11 and that of impurity-doped polysilicon film $15_2$, the thickness of oxide film $17_2$ on the surface of polysilicon film $15_2$ becomes increases over that of oxide film $17_1$.

Figure 2G:
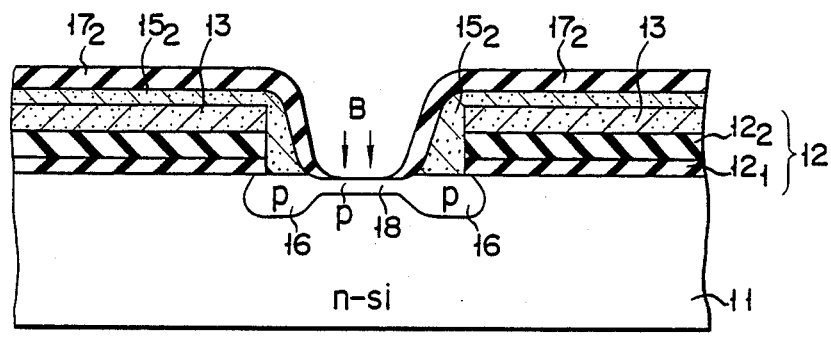

Thereafter, internal base region 18 is formed by implanting boron ions to substrate 1 through the opening, thin oxide film $17_1$ is then removed, using an etching solution containing HF, and the structure shown in FIG. 2G is obtained.

Figure 2H:
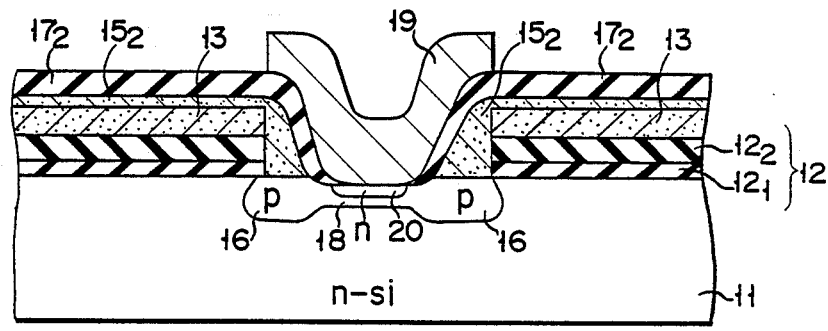
Figure 2I:
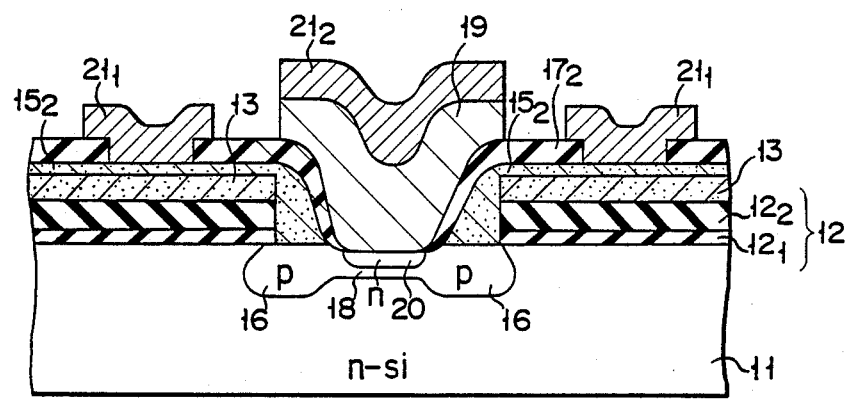

As is shown in FIG. 2H, arsenic-doped third polysilicon film 19 is deposited to a thickness of 5,000 Å and is patterned. Thereafter, arsenic is diffused into substrate 11 by annealing, to form emitter layer 20. Finally, as is shown in FIG. 2I, contact holes are formed in oxide films $17_2$, and an Al film is deposited and patterned to form base electrodes $21_1$ contacting second polysilicon film $15_2$. At the same time, emitter electrode $21_2$, contacting third polysilicon film 19, is formed to complete an npn transistor.

As is shown in FIG. 2D of the above embodiment, prior to the etching of second polysilicon film 15, the impurity contained in first polysilicon film 13 is thermally diffused to form external base region 16. Therefore, when second polysilicon film 15 is etched, as shown in FIG. 2E, boron-doped region $15_2$ of second polysilicon film 15 can be left with high controllability by utilizing the difference in etching rate caused by the presence/absence of an impurity. Furthermore, the end face, which defines the opening, of polysilicon film $15_2$ formed in this manner is inclined, as shown in FIG. 2E. For this reason, when thermal oxidation takes place, as shown in FIG. 2F, the increased volume can expand upward. Therefore, the stress applied to the substrate in the thermal oxidation can be reduced, thereby obtaining transistor characteristics having a small leakage current at the interface. Furthermore, since, in this thermal oxidation step, the oxidation speed of boron-doped polysilicon film $15_2$ is high, thick oxide film $17_2$ is formed on the end face defining the opening. Accordingly, the diameter of the opening can be reduced to obtain a narrow emitter without adding a complicated step as in the conventional technique.

A method of manufacturing an npn transistor according to another embodiment of the present invention will now be described, with reference to FIGS. 3A to 3K.

Figure 3A:
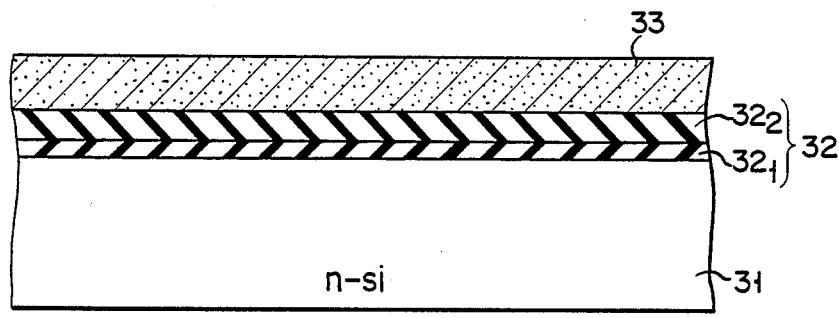
Figure 3B:
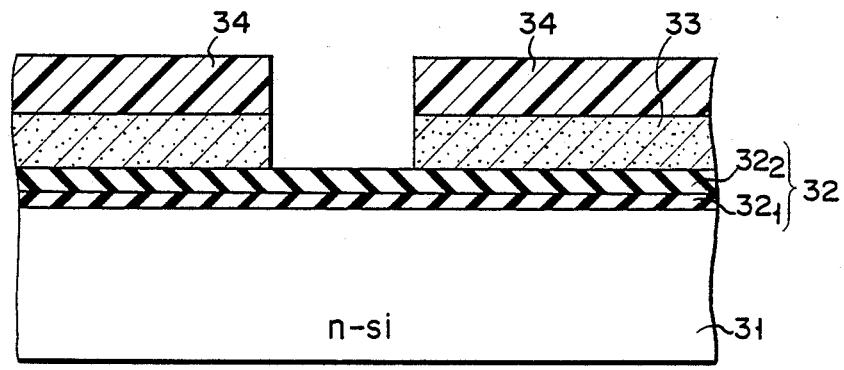
Figure 3C:
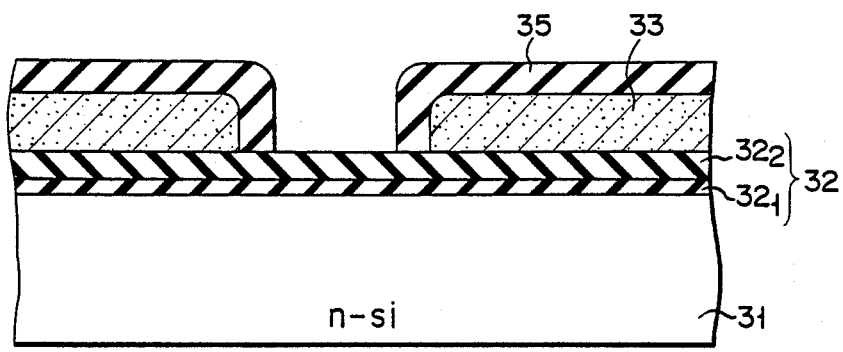

As is shown in FIG. 3A, stacked insulating film 32 constituted by oxide and nitride films $32_1$ and $32_2$ is formed on a surface of n-type Si substrate 31, after which boron-doped first polysilicon film 33 is deposited on the resultant structure. First polysilicon film 33 has a thickness of 4,000 Å, which is greater than in the case of the previous embodiment. As is shown in FIG. 3B, resist pattern 34 is formed, and first polysilicon film 33 is etched by RIE, to form an opening. Subsequently, after resist pattern 34 has been removed, the resultant structure is thermally oxidized to form oxide film 35 on the surface of first polysilicon film 33, as is shown in FIG. 3C.

Figure 3D:
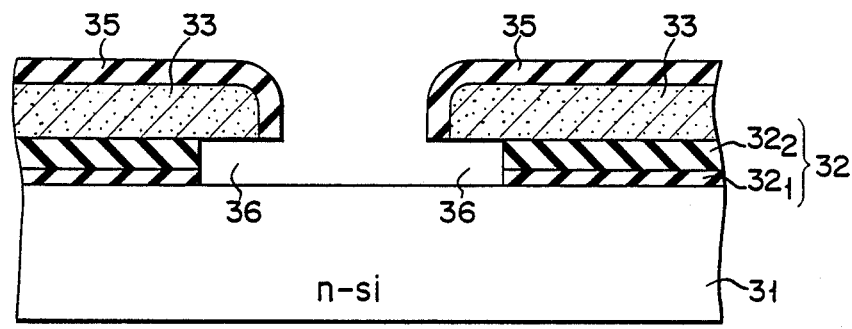
Figure 3E:
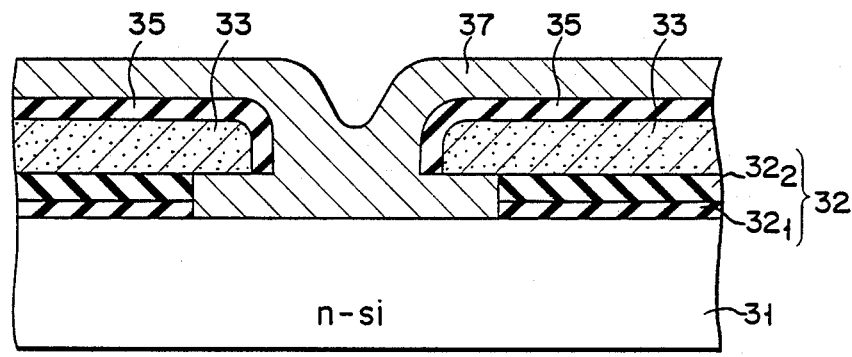

As is shown in FIG. 3D, oxide and nitride films $32_1$ and $32_2$ are etched so as to form undercut portions 36. Undercut portions 36 are formed as follows. Nitride film $32_2$ is etched for a sufficiently long period of time so that etched portions laterally extend to a predetermined length, and then oxide film $32_1$ is etched. Then, as shown in FIG. 3E, undoped second polysilicon film 37 is deposited.

Figure 3F:
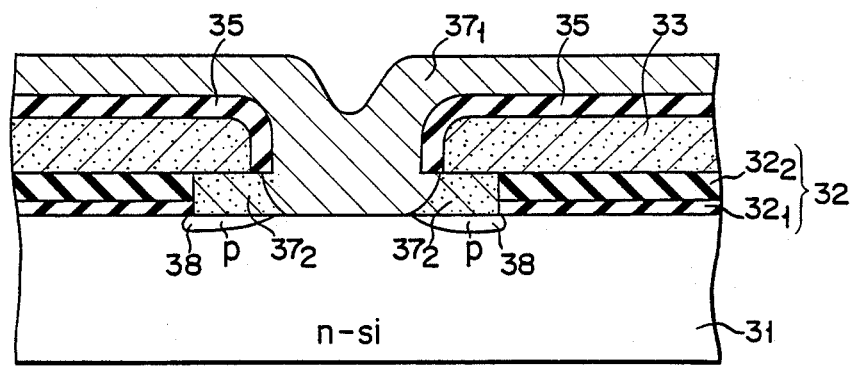

As is shown in FIG. 3F, the boron contained in first polysilicon film 33 is diffused, by thermal annealing, into part of second polysilicon film 37 and also into substrate 31, thereby forming p-type external base region 38. In this case, boron is doped in region $37_2$ of second polysilicon film 37 in undercut portions 36, whereas region $37_1$ is kept undoped. As is described in the first embodiment, diffusion in this case can be characterized in that the diffusion length is increased near the interface between second polysilicon film 37 and silicon substrate 31. The end faces of impurity regions $15_2$ and 16 are inclined because of such a unique diffusion.

Figure 3G:
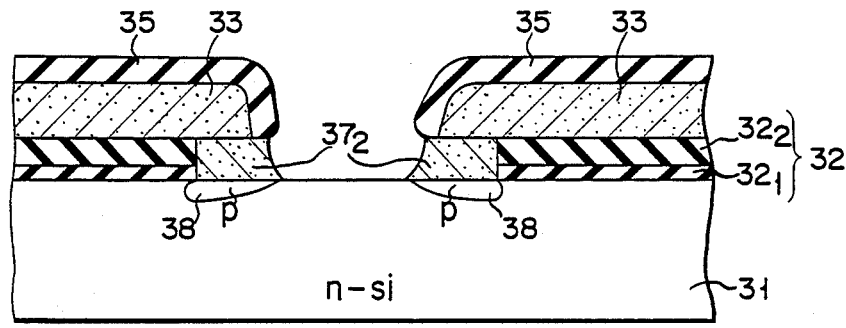

As shown in FIG. 3G, undoped region $37_1$ of second polysilicon film 37 is selectively etched using an etching solution containing hydrazine to expose a surface of substrate 31. In this case, the etched end face of second polysilicon film $37_2$, which defines the opening, has a predetermined inclination.

Figure 3H:
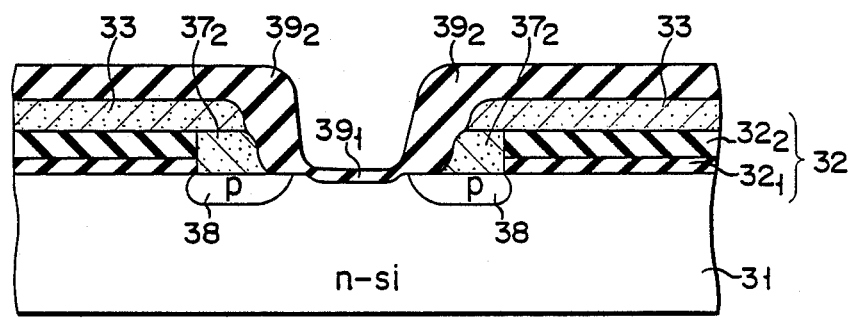
Figure 3I:
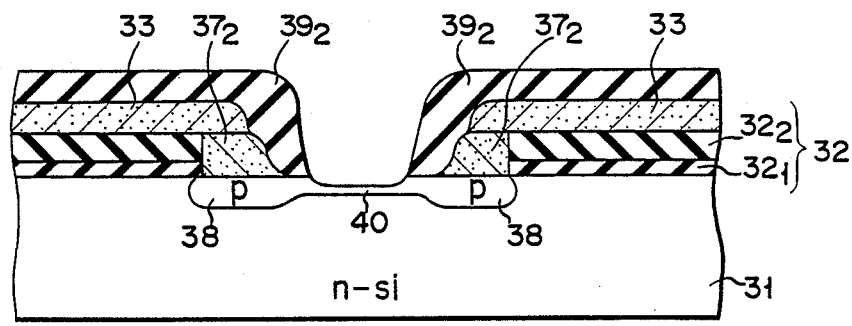

Subsequently, in a state wherein oxide film 35 is removed or left, the resultant structure is thermally oxidized to form oxide films $39_1$ and $39_2$ on the exposed surface of substrate 31 and the surfaces of polysilicon films 33 and $37_2$, respectively, as shown in FIG. 3H. Each of oxide films $39_2$ formed on the surfaces of polysilicon film 33 and $37_2$ is sufficiently thicker than oxide film $39_1$ on the surface of substrate 31. Boron ions are implanted to form p-type internal base region 40. Then, thin oxide film $39_1$ is etched using HF to obtain the state in FIG. 3I.

Arsenic-doped third polysilicon film 41 is deposited to a thickness of 5,000 Å and is patterned. Then, arsenic is diffused into substrate 31 by annealing to form n-type emitter region 42 (shown in FIG. 3J). Finally, contact holes are formed in oxide films $39_2$, and an Al film is deposited and patterned to form base and emitter electrodes $43_1$ and $43_2$, as shown in FIG. 3K.

Figure 1A:
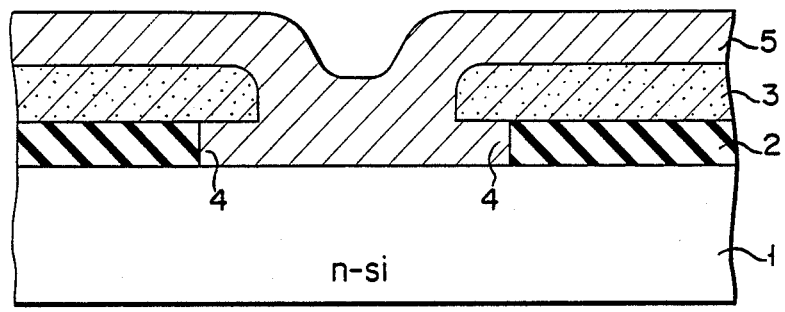
FIGS. 1A to 1C are sectional views showing the steps of manufacturing a bipolar transistor according to a conventional method.
Figure 1B:
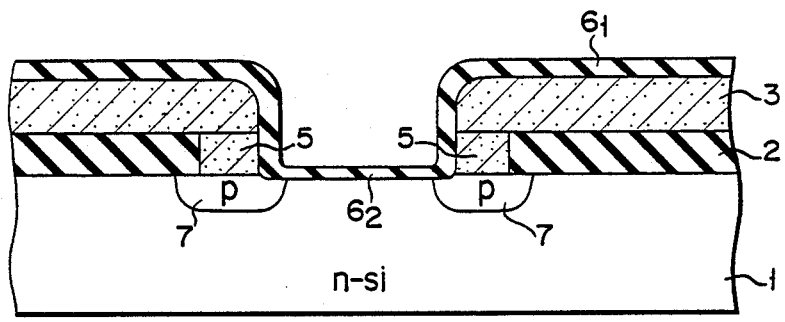
Figure 1C:
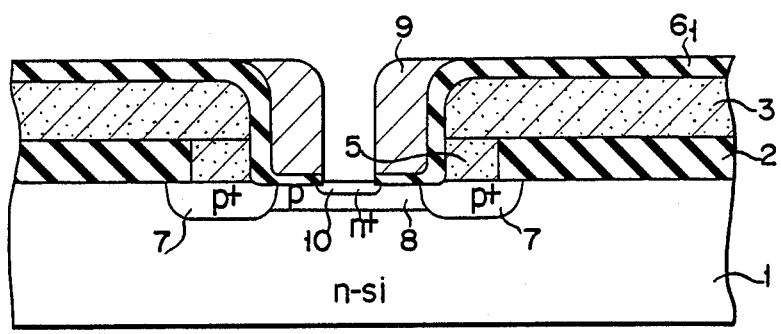

In the embodiment in FIGS. 3A to 3K, substantially the same effects as described in the first embodiment in FIGS. 2A to 2I can be obtained. Similar to the conventional example shown in FIGS. 1A to 1C, in this embodiment, undercut portions 36 are formed, and diffusion source $37_2$ is buried therein. For this reason, this embodiment is advantageous in that the width of the diffusion source, i.e., the width of external base region 38 can be desirably controlled. The present invention is especially advantageous in that the present invention can be executed according to the above-described structure without posing the problem of the conventional example shown in FIGS. 1A to 1C.

In both the embodiments, an n-type Si substrate is used, and an npn transistor using the substrate as a collector is manufactured. However, the present invention is not limited to these embodiments. When the present invention is applied to an integrated circuit, e,g, a wafer obtained by forming an n-type epitaxial layer on a p-type Si substrate may be used. In this case, after isolation of elements is performed, an npn transistor can be formed on each n-type layer in the same manner as in the above embodiments. In addition, the present invention can be applied to the manufacture of a pnp transistor by selecting suitable impurities.

What is claimed is:

1. A method of manufacturing a bipolar transistor, comprising the steps of:
   depositing an impurity-doped first polysilicon film on a semiconductor layer of a first conductivity type, with an insulating film being interposed therebetween;
   forming an opening by selectively etching said first polysilicon film and selectively etching said insulating film, using a left portion of said first polysilicon film as a mask;
   forming an external base region of a second conductivity type by depositing an undoped second polysilicon film and annealing the resultant structure, to diffuse an impurity contained in said first polysilicon film into part of said second polysilicon film and into part of said substrate;
   selectively etching said second polysilicon film, without using a mask, by employing an etching method wherein an etching rate of an undoped region is higher than that of an impurity-doped region;
   forming thick and thin oxide films on surfaces of said impurity-doped polysilicon layer and said substrate, respectively, by thermally oxidizing said left impurity-doped polysilicon layer and the exposed surface of said substrate; and
   forming an internal base region, which is connected to said external base region, in the surface layer of said substrate at said opening, and forming an emitter region in said internal base region.

2. A method according to claim 1, wherein the step of selectively etching said insulating film, using said first polysilicon film in which said opening is formed as a mask, is performed so as not to form undercut portions.

3. A method according to to claim 1, wherein said semiconductor substrate comprises a silicon substrate, and said insulating film comprises a stacked layer composed of silicon oxide and silicon nitride films.

4. A method according to claim 1, wherein said insulating film is constituted by a single layer.

5. A method according to claim 1, wherein the step of selectively etching said undoped region in said second polysilicon film is performed by wet etching, using an etchant containing hydrazine.

6. A method of manufacturing a bipolar transistor, comprising the steps of:

depositing an impurity-doped first polysilicon film on a semiconductor layer of a first conductivity type, with an insulating film being interposed therebetween;

forming an opening by selectively etching said first polysilicon film and selectively etching said insulating film, using a left portion of said first polysilicon film as a mask so as to form undercut portions;

forming an external base region of a second conductivity type by depositing an undoped second polysilicon film and annealing the resultant structure, to diffuse an impurity contained in said first polysilicon film into part of said second polysilicon film and into part of said substrate;

selectively etching said second polysilicon film, without using a mask, by employing an etching method wherein an etching speed of an undoped region is higher than that of an impurity-doped region, and burying said second polysilicon film as an impurity-doped layer in said undercut portions;

forming thick and thin oxide films on surfaces of said impurity-doped polysilicon layer and said substrate, respectively, by thermally oxidizing said surfaces of said impurity-doped polysilicon layer and said substrate; and forming an internal base region, which is connected to said external base region, in the surface layer of said substrate at said opening, and forming an emitter region in said internal base region.

7. A method according to claim 6, wherein said first polysilicon film is oxidized after said first polysilicon film is selectively etched and before said insulating film is selectively etched.

8. A method according to claim 6, wherein said semiconductor substrate comprises a silicon substrate, and said insulating film comprises a stacked layer composed of said silicon oxide and silicon nitride films.

9. A method according to claim 6, wherein said insulating film is constituted by a single layer.

10. A method according to claim 6, wherein the step of selectively etching said undoped region in said second polysilicon film is performed by wet etching, using an etchant containing hydrazine.

* * * * *